(12) United States Patent
Chen et al.

(10) Patent No.: US 12,517,166 B2
(45) Date of Patent: Jan. 6, 2026

(54) CRACK DETECTOR UNITS AND THE RELATED SEMICONDUCTOR DIES AND METHODS

(71) Applicant: TAIWAN SEMICONDUCTOR MANUFACTURING COMPANY LTD., Hsinchu (TW)

(72) Inventors: Huan-Neng Chen, Taichung (TW); Shao-Yu Li, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/773,636

(22) Filed: Jul. 16, 2024

(65) Prior Publication Data

US 2024/0369613 A1 Nov. 7, 2024

Related U.S. Application Data

(63) Continuation of application No. 17/697,925, filed on Mar. 18, 2022, now Pat. No. 12,111,346.

(51) Int. Cl.
*G01R 31/26* (2020.01)
*H01L 21/66* (2006.01)
*H01L 23/58* (2006.01)

(52) U.S. Cl.
CPC .......... *G01R 31/2601* (2013.01); *H01L 22/34* (2013.01); *H01L 23/585* (2013.01)

(58) Field of Classification Search
CPC .... G01R 31/2601; H01L 22/34; H01L 23/585
See application file for complete search history.

(56) References Cited

U.S. PATENT DOCUMENTS

| | | | |
|---|---|---|---|
| 2019/0271739 A1* | 9/2019 | Werhane | G01R 31/2856 |
| 2019/0287879 A1* | 9/2019 | Sauter | H01L 23/488 |
| 2020/0150174 A1* | 5/2020 | Kumar | H05K 1/0254 |

\* cited by examiner

*Primary Examiner* — Nasima Monsur
*Assistant Examiner* — Courtney G McDonnough
(74) *Attorney, Agent, or Firm* — WPAT LAW; Anthony King

(57) ABSTRACT

The present disclosure provides a crack detection unit (CDU), a semiconductor die, and a method of detecting a crack of a semiconductor die. The CDU comprises a switching circuit, a crack sensor, and a logic circuit. The switching circuit is configured to enable the crack sensor. The crack sensor is configured to be electrically connected to the switching circuit, the ground, and an operating voltage. The logic circuit is configured to be electrically connected to the switching circuit and the crack sensor, wherein the CDU is enabled based on an input of the logic circuit. The output of the logic circuit indicates whether the crack sensor contains a crack.

20 Claims, 12 Drawing Sheets

CRACK DETECTOR UNITS AND THE RELATED SEMICONDUCTOR DIES AND METHODS

CROSS-REFERENCE TO RELATED APPLICATIONS

This application is a continuation application of application Ser. No. 17/697,925, filed Mar. 18, 2022 and entitled "CRACK DETECTOR UNITS AND THE RELATED SEMICONDUCTOR DIES AND METHODS", the entirety of which is/are incorporated by reference herein.

BACKGROUND

The present invention relates generally to crack detection devices, and more particularly to crack detection devices for semiconductor devices.

Defects, such as cracks, generated in semiconductor dies or packages can negatively affect electrical operation and reliability. Therefore, it is necessary to accurately determine whether defects have occurred therein.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
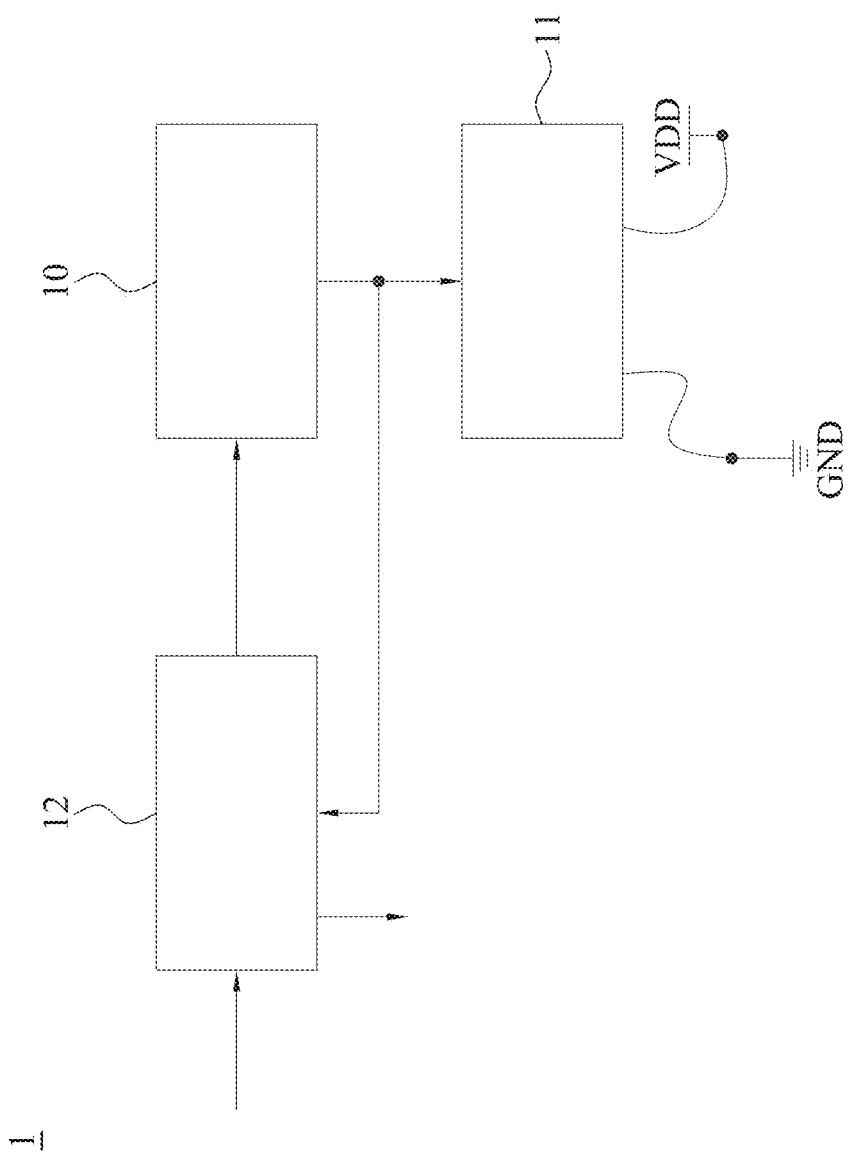
FIG. 1 illustrates an exemplary schematic view of a crack detector unit (CDU), in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In semiconductor manufacturing, low-k dielectric material refers to a material with a small relative dielectric constant relative to silicon dioxide. Low-k dielectric material implementation is one of several strategies used to allow continued scaling of microelectronic devices. In semiconductor circuits, insulating dielectrics separate the conducting parts (wire interconnects and transistors). As components are scaled and transistors are manufactured in closer proximity, insulating dielectrics have thinned to the point where charge buildup and crosstalk can adversely affect performance of the device. Replacing the silicon dioxide with a low-k dielectric of the same thickness reduces parasitic capacitance, enabling faster switching speeds and lower heat dissipation.

However, the low-k dielectric material cracks easily during manufacture. To detect cracks formed in the semiconductor devices or semiconductor packages, a crack detector unit is used.

FIG. 1 illustrates an exemplary schematic view of a crack detector unit (CDU) 1, in accordance with some embodiments of the present disclosure. The CDU 1 comprises a switching circuit 10, a crack sensor 11, and a logic circuit 12. The switching circuit 10 is electrically connected to the crack sensor 11 and the logic circuit 12. The switching circuit 10 is configured to enable the crack sensor 11 to function. The crack sensor 11 is electrically connected to the switching circuit 10, the ground GND, and an operating voltage VDD. The logic circuit 12 is electrically connected to the switching circuit 10 and the crack sensor 11. The logic circuit 12 may have a setup input and a self-detection input. The logic circuit 12 may have an output. The self-detection input of the logic circuit 12 is electrically connected to the switching circuit 10 and the crack sensor 11.

The setup input of the logic circuit 12 may be used to configure the CDU 1. The CDU 1 may be configured in a crack detection mode based on the signal at the setup input of the logic circuit 12. The CDU 1 may be configured in a normal mode based on the signal at the setup input of the logic circuit 12. The setup input of the logic circuit 12 may be used to configure the switching circuit 10. The switching circuit 10 may be turned on or turned off based on the signal at the setup input of the logic circuit 12. When the switching circuit 10 is turned on, the CDU 1 is in crack detection mode. When the switching circuit 10 is turned off, the CDU 1 is in normal mode. An output of the logic circuit 12 indicates whether the crack sensor 11 contains a crack. In some embodiments, the CDU 1 may be built in a semiconductor die.

Figure 2A:
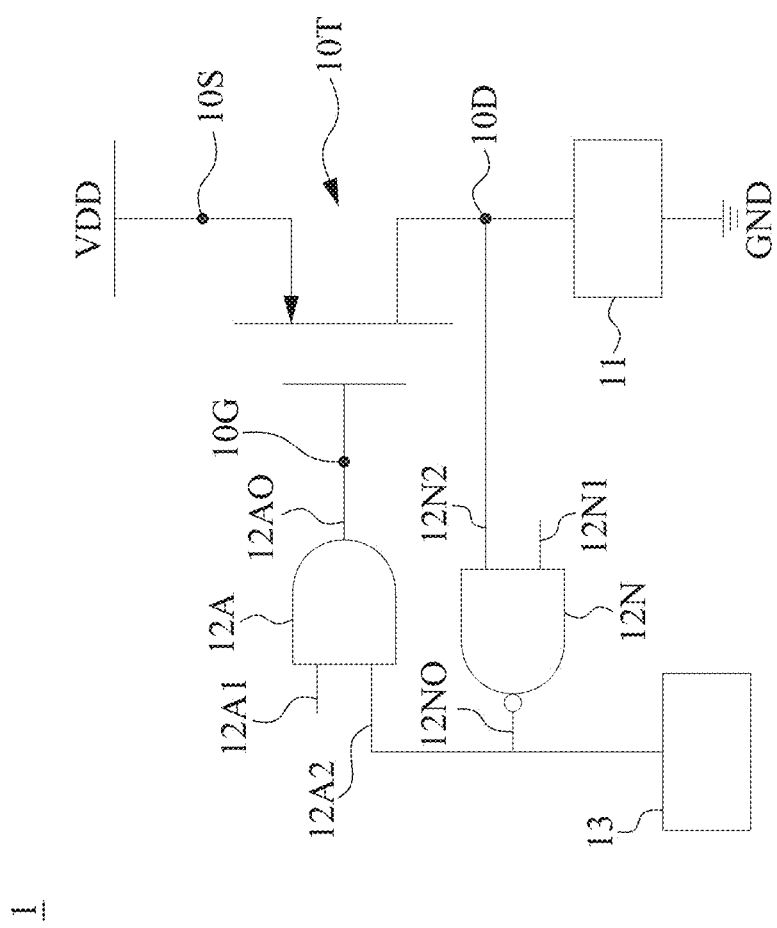
FIG. 2A illustrates an exemplary schematic view of a CDU, in accordance with some embodiments of the present disclosure.

FIG. 2A illustrates an exemplary schematic view of the CDU 1, in accordance with some embodiments of the present disclosure. FIG. 2A may show an embodiment of the CDU 1 of FIG. 1. The switching circuit 10 comprises a metal-oxide-semiconductor field-effect transistors (MOSFET). In some embodiments, the switching circuit 10 comprises a p-type MOSFET (PMOS) 10T. A source electrode 10S of the PMOS 10T is electrically connected to the operating voltage VDD. A drain electrode 10D of the PMOS 10T is electrically connected to the crack sensor 11. The drain electrode 10D of the PMOS 10T is electrically connected to the logic circuit 12. A gate electrode 10G of the PMOS 10T is electrically connected to the logic circuit 12. Via the switching circuit 10, the CDU 1 is switched to detect cracks in a semiconductor die. Via the switching circuit 10, the crack sensor 11 is enabled or disabled. Via the switching circuit 10, the CDU 1 switches between the crack detection mode and the normal mode.

Figure 2B:
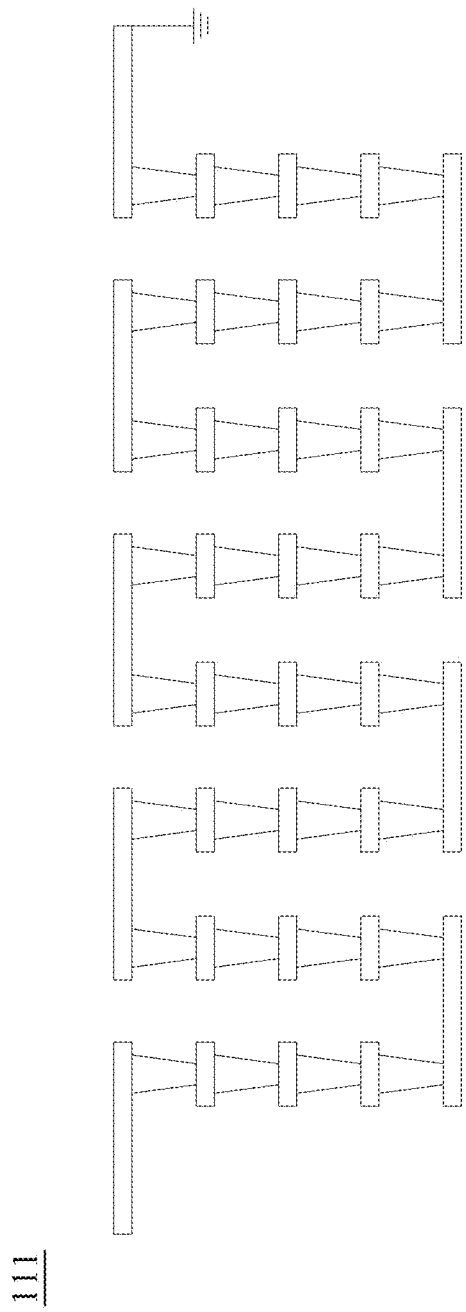
FIG. 2B illustrates an exemplary schematic view of a metal pattern, in accordance with some embodiments of the present disclosure.

In some embodiments, the crack sensor 11 is formed in a semiconductor die. The crack sensor 11 may comprise a metal pattern. In some embodiments, the crack sensor 11 may comprise multiple metal layers and vias. FIG. 2B illustrates an exemplary schematic view of a metal pattern 111, in accordance with some embodiments of the present disclosure. The crack sensor 11 may comprises the metal pattern 111. The left end of the metal pattern 111 may be connected to the drain electrode 10D of the PMOS 10T. The right end of the metal pattern 111 is connected to the ground. The metal pattern 111 has no cracks.

Figure 2C:
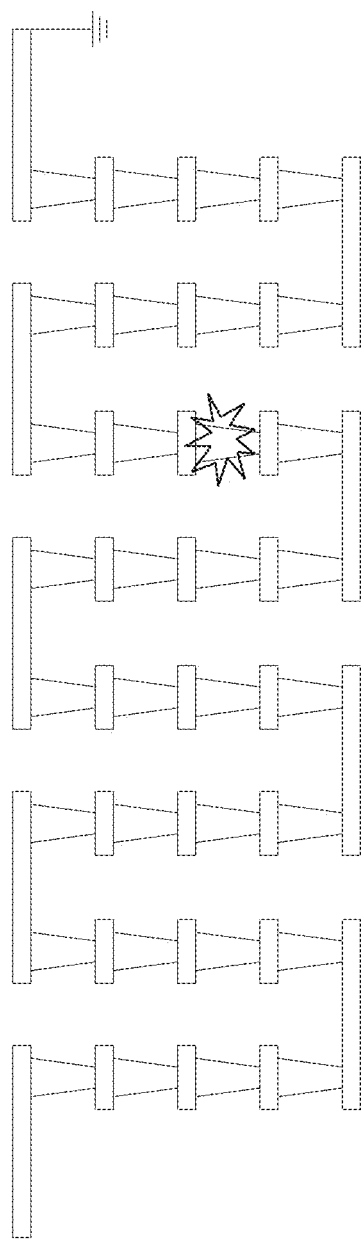
FIG. 2C illustrates an exemplary schematic view of a metal pattern, in accordance with some embodiments of the present disclosure.

FIG. 2C illustrates an exemplary schematic view of a metal pattern 112, in accordance with some embodiments of the present disclosure. The crack sensor 11 may comprises the metal pattern 112. The left end of the metal pattern 112 may be connected to the drain electrode 10D of the PMOS 10T. The right end of the metal pattern 112 is connected to the ground. The metal pattern 112 has at least one crack. The metal pattern 112 may thus form an open circuit.

The logic circuit 12 may include an AND logic gate 12A and an NAND logic gate 12N. The logic circuit 12 includes an input 12A1 and an input 12N1. The signals at the inputs 12A1 and 12N1 may be used to configure the CDU 1. The CDU 1 may be configured in a crack detection mode based on the signals at the inputs 12A1 and 12N1. The CDU 1 may be configured in a normal mode based on the signals at the inputs 12A1 and 12N1. The signals at the inputs 12A1 and 12N1 may be used to configure the switching circuit 10. The switching circuit 10 may be turned on or turned off based on the signals at the inputs 12A1 and 12N1.

The AND logic gate 12A generates a signal at an output 12AO to the switching circuit 10 based on the signals at the input 12A1 and an output 12NO of the logic circuit 12. The NAND logic gate 12N generates a signal at the output 12NO of the logic circuit 12 based on the signals at the input 12N1 and an input 12N2. The signal at the input 12N2 indicates a status of the crack sensor 11.

The gate electrode 10G of the PMOS 10T is electrically connected to the output 12AO of the AND logic gate 12A. The input 12N2 of the NAND logic gate 12N is electrically connected to the drain electrode 10D of the PMOS 10T. The input 12N2 of the NAND logic gate 12N is electrically connected to the crack sensor 11. The output 12NO of the NAND logic gate 12N is electrically connected to a detection pad 13. The output 12NO of the NAND logic gate 12N is electrically connected to the input 12A2 of the AND logic gate 12A. The detection pad 13 indicates whether the crack sensor 11 contains a crack. In some embodiments, the detection pad 13 is single ended. The detection pad 13 is placed near the CDU 1. Placement of the detection pad 13 requires no special expertise.

Figure 3A:
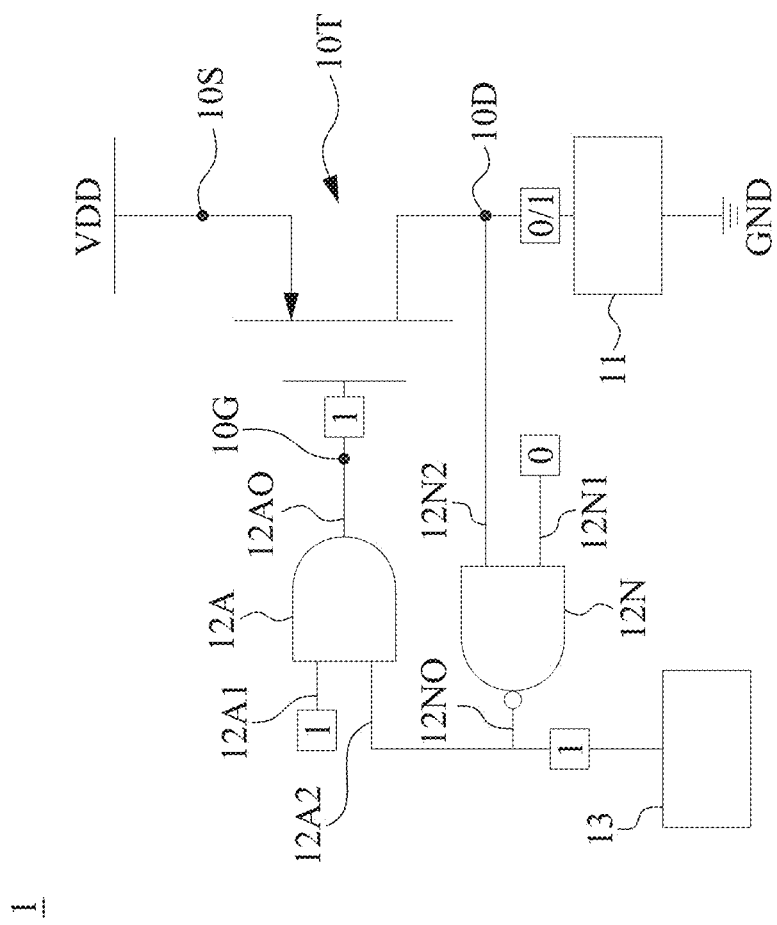
FIGS. 3A-3C illustrate exemplary operations of a CDU, in accordance with some embodiments of the present disclosure.

FIG. 3A illustrates an exemplary operation of CDU 1, in accordance with some embodiments of the present disclosure. The CDU 1 is set to normal mode. As shown in FIG. 3A, digital state "0" is set to the input 12N1 of the NAND logic gate 12N. Irrespective of the digital state of the input 12N2, the digital state of the output 12NO of the NAND logic gate 12N is "1." Since the digital state of the input 12N2 indicates the status of the crack sensor 11, irrespective of whether the crack sensor 11 contains a crack, after the operation of the NAND logic gate 12N, the digital state of the output 12NO of the NAND logic gate 12N is "1." As shown in FIG. 3A, digital state "1" is set to the input 12A1 of the AND logic gate 12A. Since the digital state of the output 12NO of the NAND logic gate 12N is "1," the digital state of the input 12A2 is "1." After the operation of the AND logic gate 12A, the digital state of the output 12AO of the AND logic gate 12A is "1." The digital state "1" at the output 12AO provides a high voltage to the gate electrode 10G of the PMOS 10T. Thus, the digital state "1" at the output 12AO turns off the PMOS 10T. Hence, the CDU 1 is disabled or in a normal mode. FIG. 3A illustrates initial setup of the CDU 1.

Figure 3B:
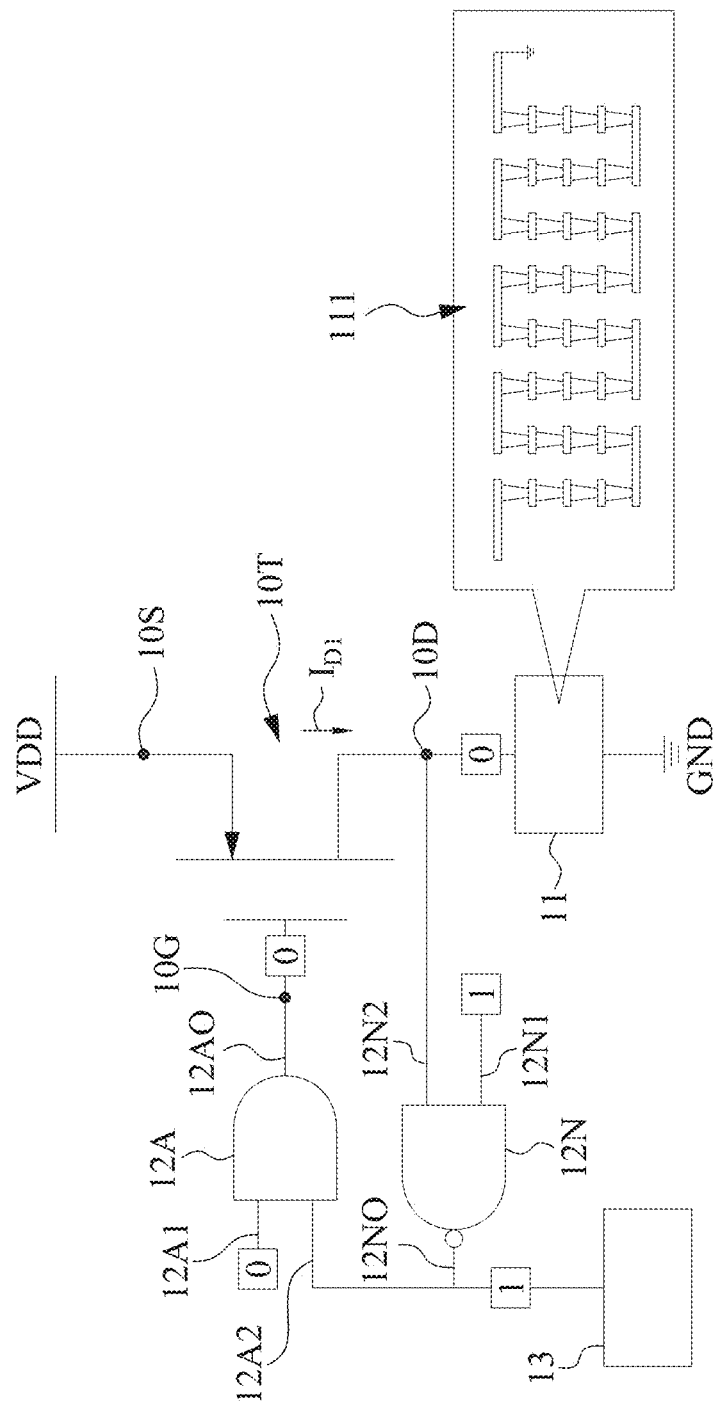

FIG. 3B illustrates an exemplary operation of CDU 1, in accordance with some embodiments of the present disclosure. The CDU 1 is set to crack detection mode. As shown in FIG. 3B, digital state "O" is set to the input 12A1 of the AND logic gate 12A, and digital state "1" is set to the input 12N1 of the NAND logic gate 12N. Since the digital state of the input 12A1 of the AND logic gate 12A is "0," irrespective of the digital state of the input 12A2, the digital state of the output 12AO of the AND logic gate 12A is "0." The digital state "0" at the output 12AO provides a low voltage to the gate electrode 10G of the PMOS 10T. Thus, the digital state "O" at the output 12AO turns on the PMOS 10T. A current ID1 of the PMOS 10T is generated.

As shown in FIG. 3B, the metal pattern 111 in crack sensor 11 contains no crack. The drain electrode 10D of the PMOS 10T and the crack sensor 11 are shorted to ground, and thus digital state "O" is input to the input 12N2 of the NAND logic gate 12N. The input 12N1 of the NAND logic gate 12N is set to digital state "1." After the operation of the NAND logic gate 12N, the output 12NO of the NAND logic gate 12N is "1." The detection pad 13 outputs digital state "1." The digital state of input 12A2 of the AND logic gate 12A is "1" as well. Since digital state "O" is set to the input 12A1 of the AND logic gate 12A, the output 12AO of the AND logic gate 12A is "0" after the operation of the AND logic gate 12A. The digital state "1" of the detection pad 13 indicates that no crack is detected. FIG. 3B illustrates self-detection of the CDU 1. The CDU 1 is enabled or set to a crack detection mode based on the input 12N1 and/or the input 12A1 of the logic circuit 12.

Figure 3C:
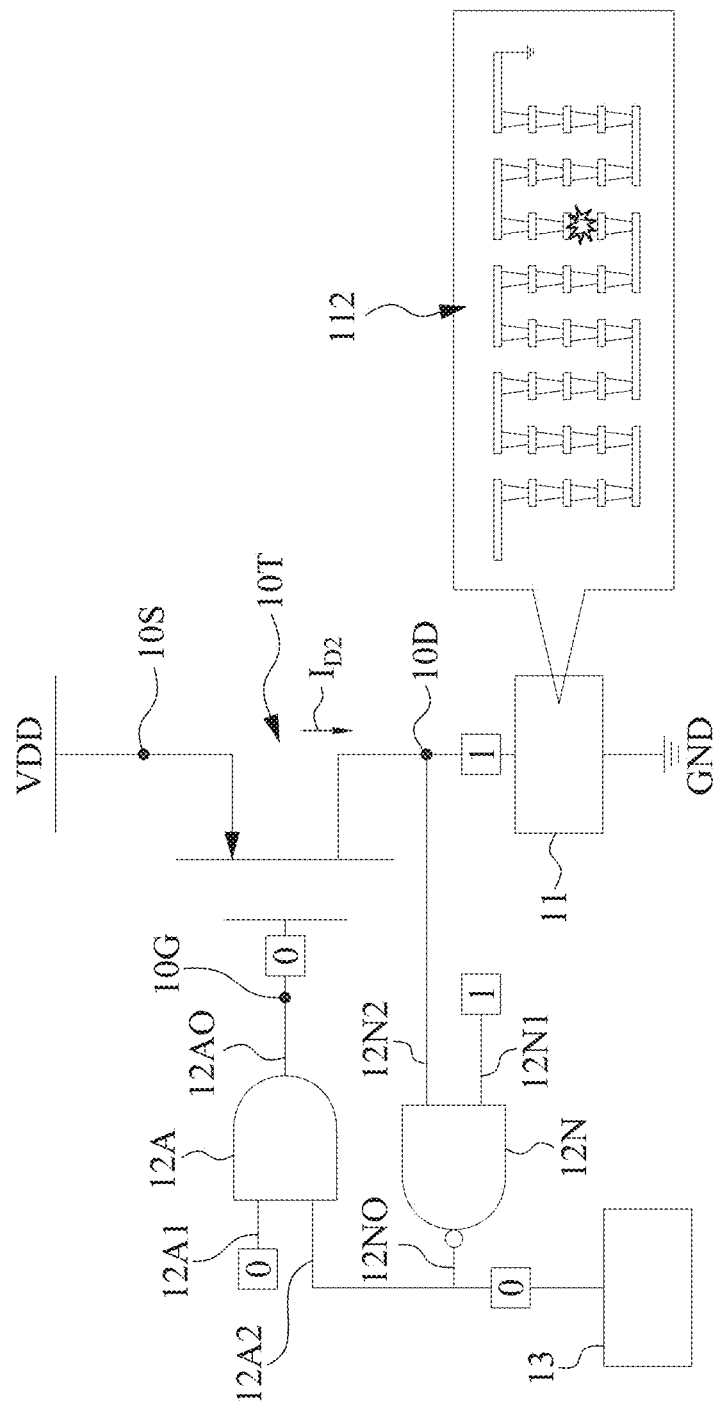

FIG. 3C illustrates an exemplary operation of CDU 1, in accordance with some embodiments of the present disclosure. The CDU 1 is set to crack detection mode. As shown in FIG. 3B, digital state "O" is set to the input 12A1 of the AND logic gate 12A, and digital state "1" is set to the input 12N1 of the NAND logic gate 12N. Since the digital state of the input 12A1 of the AND logic gate 12A is "0," irrespective of the digital state of the input 12A2, the digital state of the output 12AO of the AND logic gate 12A is "0." The digital state "O" at the output 12AO provides a low voltage to the gate electrode 10G of the PMOS 10T. Thus, the digital state "O" at the output 12AO turns on the PMOS 10T. A current ID2 of the PMOS 10T is generated.

As shown in FIG. 3C, the metal pattern 112 of the crack sensor 11 contains a crack. The drain electrode 10D of the PMOS 10T and the crack sensor 11 are not shorted to ground GND, and thus digital state "1" is input to the input 12N2 of the NAND logic gate 12N. The input 12N1 of the NAND logic gate 12N is set to digital state "1." After the operation of the NAND logic gate 12N, the output 12NO of the NAND logic gate 12N is "0." The detection pad 13 outputs digital state "0." The digital state of input 12A2 of the AND logic gate 12A is "0." A digital state "O" is set to the input 12A1 of the AND logic gate 12A. After the operation of the AND logic gate 12A, the output 12AO of the AND logic gate 12A is "0." The digital state "O" of the detection pad 13 indicates that a crack is detected. FIG. 3C illustrates self-detection of the CDU 1.

The current ID2 in FIG. 3C may be much lower than the current ID1 in FIG. 3B. The metal pattern 112 containing a crack can be viewed as an open circuit or a resistor with high resistance. If the product of the ID2 and the equivalent resistance of the metal pattern 112 exceeds half of the operating voltage VDD, the input 12N2 of the NAND logic gate 12N is set to digital state "1."

The CDU 1 can perform a fully on-chip built-in-self-test (BIST) as illustrated in FIGS. 3A-3C. When performing the fully on-chip BIST, no other test pads are needed. Only the detection pad 13 is needed. The CDU 1 can identify the location of the crack based on the digital state of the detection pad 13. Hence, the CDU 1 can perform crack detection alarm and/or diagnosis.

The detection pad 13 may be placed near the CDU 1. This can improve the layout efficiency of a semiconductor die. The CDU 1 can be scalable and modulated. The CDU 1 is a simple circuit for both I/O and core devices in a semiconductor die. It can show clear digital state 0 or 1 for both normal mode and crack detection modes.

In a semiconductor die, the ground GND is widely distributed on the semiconductor die. $I^2C$ or serial peripheral interface (SPI) controllers and shift registers are needed for the semiconductor die. The CDU 1 may be electrically connected to the ground and the $I^2C$ or serial peripheral interface (SPI) controllers and shift registers.

Figure 4A:
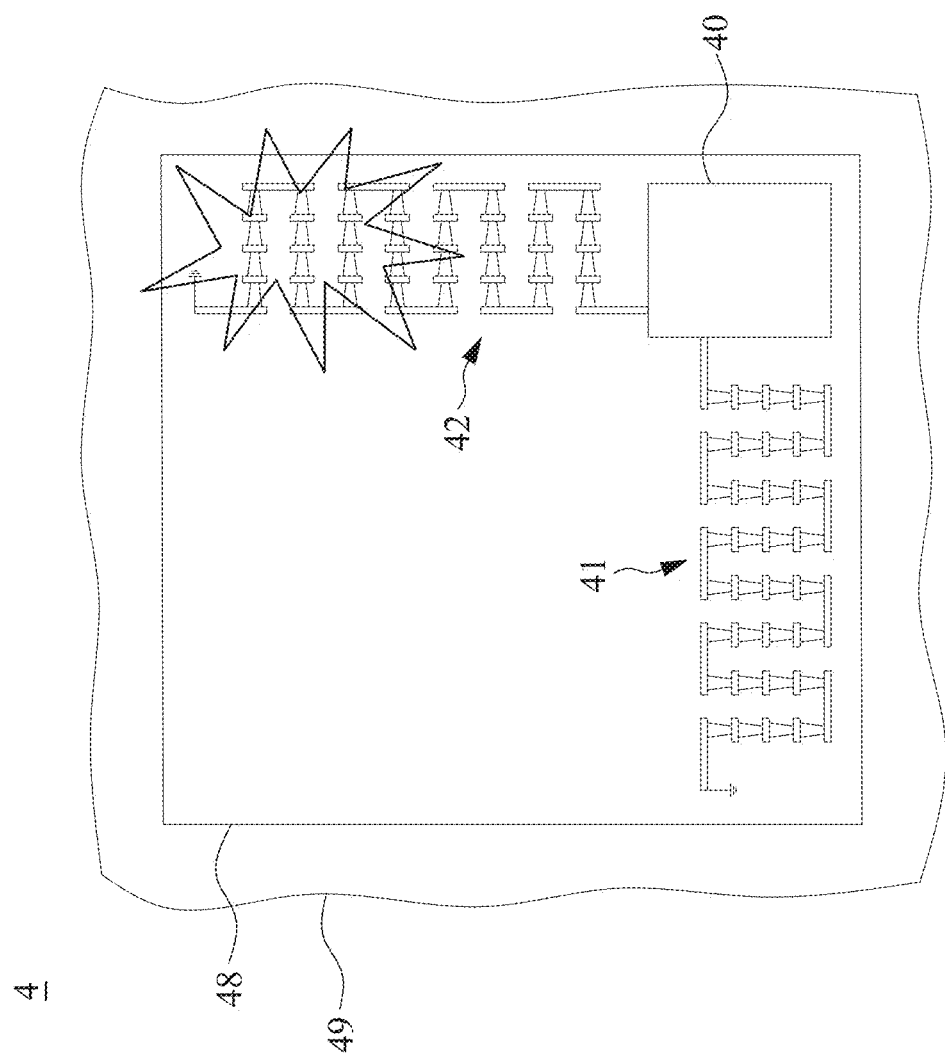
FIG. 4A illustrates an exemplary schematic view of a semiconductor die, in accordance with some embodiments of the present disclosure.

FIG. 4A illustrates an exemplary schematic view of a semiconductor die 4, in accordance with some embodiments of the present disclosure. The semiconductor 4 includes a CDU 40. As shown in FIG. 4A, the semiconductor die 4 is singulated. A seal ring 48 surrounds the edges of the semiconductor die 4. The CDU 40 is placed on a corner of the semiconductor die 4. A crack sensor 41 is disposed adjacent to at least one edge of the semiconductor die 4. The crack sensor 41 is connected to the CUD 40 and placed near the CDU 40. Another crack sensor 42 is disposed adjacent to another edge of the semiconductor die 4. The crack sensor 42 is also connected to the CUD 40 and placed near the CDU 40. The crack sensors 41 and 42 are placed along different orientations with respect to the CDU 40. Some available pads of the semiconductor die 4 can be used as the detection pad 13 of the CDU 40. In some embodiments, the semiconductor die 4 comprises an active die or a passive die.

In the semiconductor 4 of FIG. 4A, one or more cracks may be generated in crack sensor 42 because of a defective singulation (indicated as the square formed by line 49).

Figure 4B:
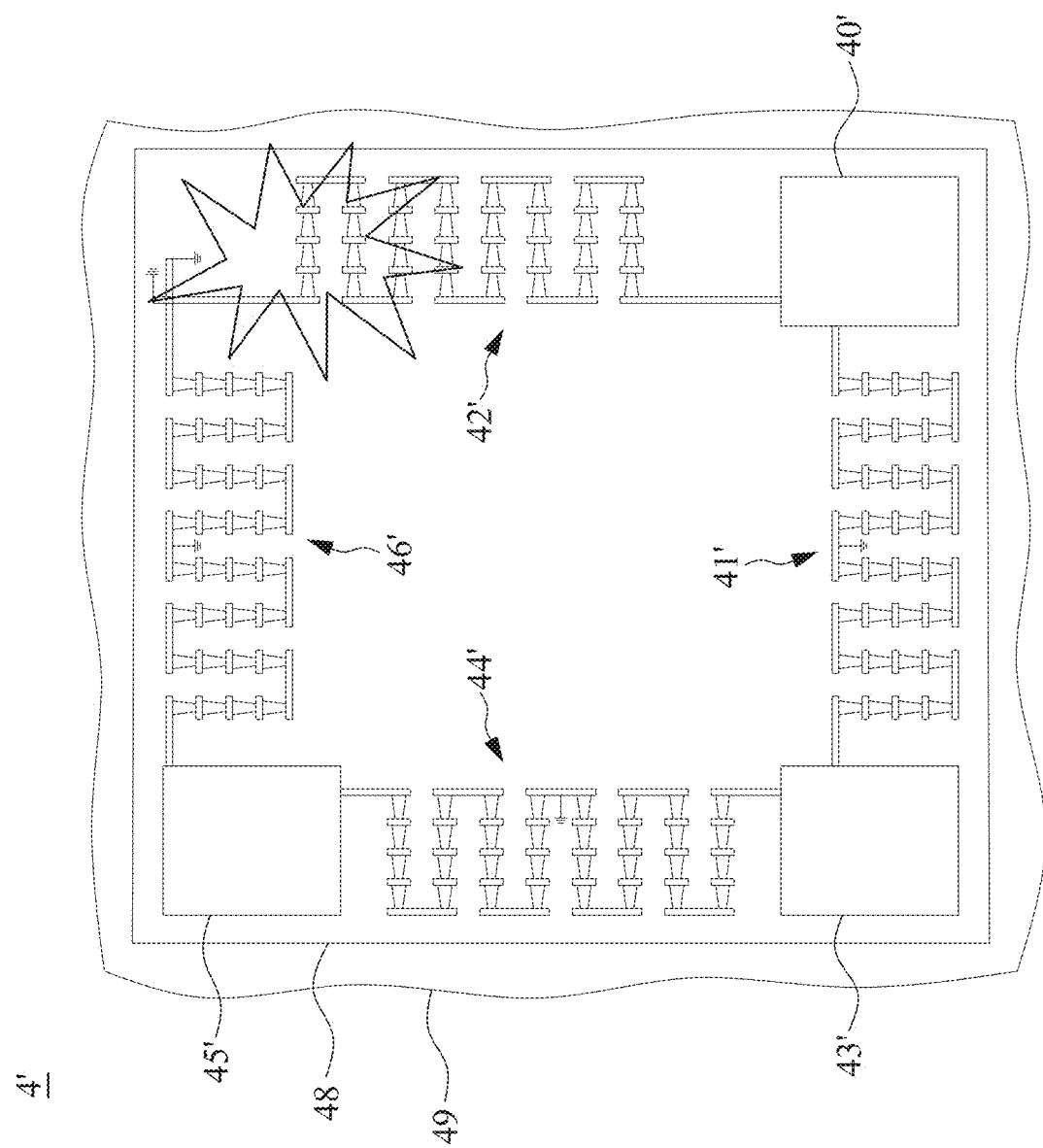
FIG. 4B illustrates an exemplary schematic view of a semiconductor die, in accordance with some embodiments of the present disclosure.

FIG. 4B illustrates an exemplary schematic view of a semiconductor die 4', in accordance with some embodiments of the present disclosure. The semiconductor die 4' has CDUs 40', 43', and 45'. As shown in FIG. 4B, CDUs 40', 43' and 45' can be placed on three different corners of a semiconductor die 4'. A crack sensor 41' is disposed adjacent to at least one edge of the semiconductor die 4'. A crack sensor 42' is disposed near at least one edge of the semiconductor die 4'. A crack sensor 44' is disposed adjacent to the other edge of the semiconductor die 4'. Each crack sensor 41', 42', and 44' is placed near the CDU 40', 43', or 45'. Each crack sensor 41', 42', and 44' may be connected to one or more of the CDUs 40', 43', and 45'. In some embodiments, the CDU 40' is electrically connected to the crack sensors 41' and 42', the CDU 43' is electrically connected to the crack sensor 41' and a crack sensor 44', and the CDU 45' is electrically connected to the crack sensor 44' and a crack sensor 46'. The crack sensors 41' and 42' are placed along different orientations with respect to the CDU 40'. The crack sensors 41' and 44' are placed along different orientations with respect to the CDU 43'.

The crack sensor 41' is electrically connected to the CDUs 40' and 43'. The crack sensors 41' is placed between the CDUs 40' and 43'. The crack sensor 41' may be placed near the CDUs 40' and 43'. The crack sensor 44' is electrically connected to the CDUs 43' and 45'. The crack sensors 44' is placed between the CDUs 43' and 45'. The crack sensor 44' may be placed near the CDUs 43' and 45'. The crack sensor 41' may be placed near the CDU 40' and 43'. The crack sensor 42' may be placed near the CDU 40'. The crack sensor 44' may be placed near the CDU 43' and 45'. The crack sensor 46' may be placed near the CDU 45'. The placement of the CDUs 40', 43' and 45' can be efficiently arranged for the area of the semiconductor die 4'.

In the semiconductor 4' of FIG. 4B, one or more cracks may be generated in crack sensor 42' because of defective singulation (indicated as the square formed by line 49).

Figure 5:
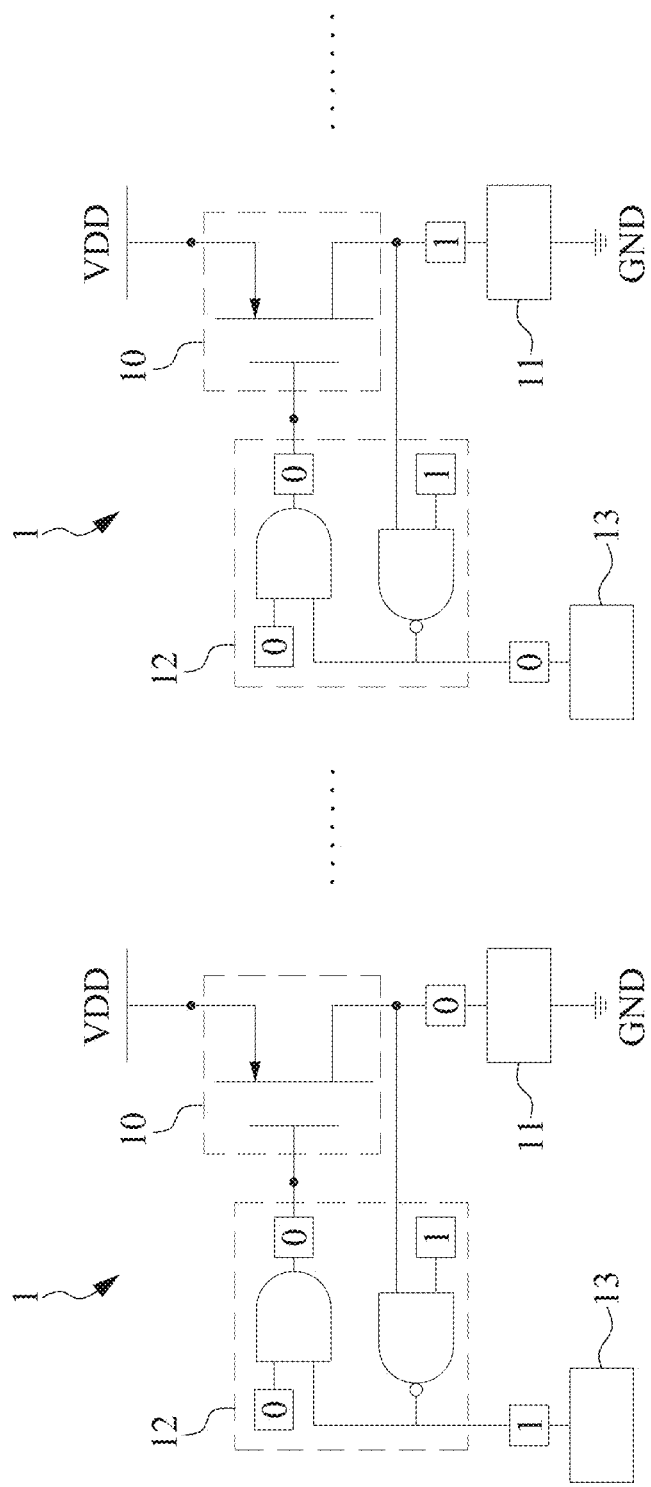
FIG. 5 illustrates exemplary CDUs, in accordance with some embodiments of the present disclosure.

FIG. 5 illustrates exemplary operations of the multiple CDUs 1, in accordance with some embodiments of the present disclosure. The multiple CDUs 1 may be disposed in a semiconductor die (e.g., the semiconductor die 4). The number of the multiple CDUs 1 may be two or more, for example 8, 16 or other positive integers. In some embodiments of FIG. 5, if one crack sensor 11 is shorted to ground (i.e., no crack exists), the corresponding detection pad 13 may output a digital state "1." If one crack sensor 11 is open or has high resistance (i.e., a crack exists), the corresponding detection pad 13 may output a digital state "0." The CDUs 1 can detect the one or more cracks formed in a semiconductor die. The test is a BIST.

The digital states at the detection pads 13 of the CDUs 1 in FIG. 5 may form a digital signal consisting of several bits. For example, when the number of the multiple CDUs 1 is 8, the digital states at the corresponding 8 detection pads 13 may form a digital signal consisting of 8 bits. When the number of the multiple CDUs 1 is 32, the digital states at the corresponding 32 detection pads 13 may form a digital signal consisting of 32 bits. The digital states at the detection pads 13 of the CDUs 1 can be used to determine which crack sensor 11 contains a crack. The digital states at the detection pads 13 of the CDUs 1 can be used to determine which part of the semiconductor die contains a crack. The digital signal formed by the digital states at the detection pads 13 of the CDUs 1 can be used to determine which crack sensor 11 contains a crack. The digital signal formed by the digital states at the detection pads 13 of the CDUs 1 can be used to determine which part of the semiconductor die contains a crack.

In some embodiments, if a semiconductor die contains no crack, the digital states at the detection pads 13 of the CDUs 1 are all digital state "1." If a semiconductor die contains no crack, the bits of the digital signal formed by the digital states at the detection pads 13 of the CDUs 1 are all "1."

In some embodiments, if a semiconductor die contains a crack, the digital states at the detection pads 13 of the CDUs 1 contain a digital state "0." The digital states provided by the CDUs 1 in the semiconductor die 4 are clear to be detected, read, or sensed. If a semiconductor die contains a crack, the bits of the digital signal formed by the digital states at the detection pads 13 of the CDUs 1 contain a "0." The location of the crack can be detected based on the digital states at the detection pads 13 of the CDUs 1 in the semiconductor die. The location of the crack can be detected based on the bits of the digital signal formed by the digital states at the detection pads 13 of the CDUs 1 in the semiconductor die. The crack sensor 11 (or the metal pattern) in which a crack happens can be located based on the digital states at the detection pads 13 of the CDUs 1 in the semiconductor die. The crack sensor 11 (or the metal pattern) in which a crack happens can be located based on the bits of the digital signal formed by the digital states at the detection pads 13 of the CDUs 1 in the semiconductor die. By identifying the locations of the cracks (or the crack sensors 11 in which a crack happens), crack detector alarm and diagnosis can be performed.

Table 1 is an exemplary lookup table for the digital signal formed by the three digital states at the three detection pads 13 of the three CDUs 1 in the semiconductor die. The digital signal formed by the three digital states at the three detection pads 13 of the three CDUs 1 includes three bits. A digital signal of "000" can indicate that the three crack sensors (or metal patterns) all include at least one crack. The digital signal of "010" may indicate that both the first and third crack sensors (or metal patterns) include at least one crack and the second crack sensor (or metal pattern) has no crack. The digital signal of "101" may indicate that both the first and third crack sensors (or metal patterns) have no crack and the second crack sensor (or metal pattern) includes at least one crack.

Through a lookup table, the locations of the cracks can be detected based on the digital states at the detection pads 13 of the CDU 1 in the semiconductor die. Through a lookup table, the locations of the cracks can be detected based on the bits of the digital signal formed by the digital states at the detection pads 13 of the CDUs 1 in the semiconductor die. Through a lookup table, the crack sensor 11 (or the metal pattern) in which a crack happens can be located based on the digital states at the detection pads 13 of the CDUs 1 in the semiconductor die. Through a lookup table, the crack sensor 11 (or the metal pattern) in which a crack happens can be located based on the bits of the digital signal formed by the digital states at the detection pads 13 of the CDUs 1 in the semiconductor die. Based on the appearance of the digital state "0," the location of the crack can be detected by the BIST.

TABLE 1

| First crack sensor | Second crack sensor | Third crack sensor |
|---|---|---|
| 0 | 0 | 0 |
| 0 | 0 | 1 |
| 0 | 1 | 0 |
| 0 | 1 | 1 |
| 1 | 0 | 0 |
| 1 | 0 | 1 |
| 1 | 1 | 0 |
| 1 | 1 | 1 |

If multiple crack sensors 11 of multiple CDUs 1 are formed on different semiconductor dies of a semiconductor device, a lookup table for the digital states at the detection pads 13 of the CDUs 1 can be used to determine which semiconductor die includes a crack. For example, the first to third crack sensors shown in Table 1 may be disposed in different semiconductor dies. The digital signal of "000" may indicate that the three semiconductor dies all include at least one crack. The digital signal of "010" may indicate that both the first and third semiconductor dies include at least one crack and the second semiconductor die has no crack. The digital signal of "101" may indicate that both the first and third semiconductor dies have no crack and the second semiconductor die includes at least one crack. By checking the lookup table, the location of the crack can be identified easily in one test.

In a further embodiment, the first and second crack sensors shown in Table 1 may be disposed in a first semiconductor die, and the third crack sensor shown in Table 1 may be disposed in a second semiconductor die. The digital signal of "000" may indicate that each of the two observed parts of the first semiconductor dies includes at least one crack and the second semiconductor die includes at least one crack. The digital signal of "001" may indicate that each of the two observed parts of the first semiconductor dies includes at least one crack and the second semiconductor die has no crack. The digital signal of "110" may indicate that both of the two observed parts of the first semiconductor die has no crack and the second semiconductor includes at least one crack.

Figure 6:
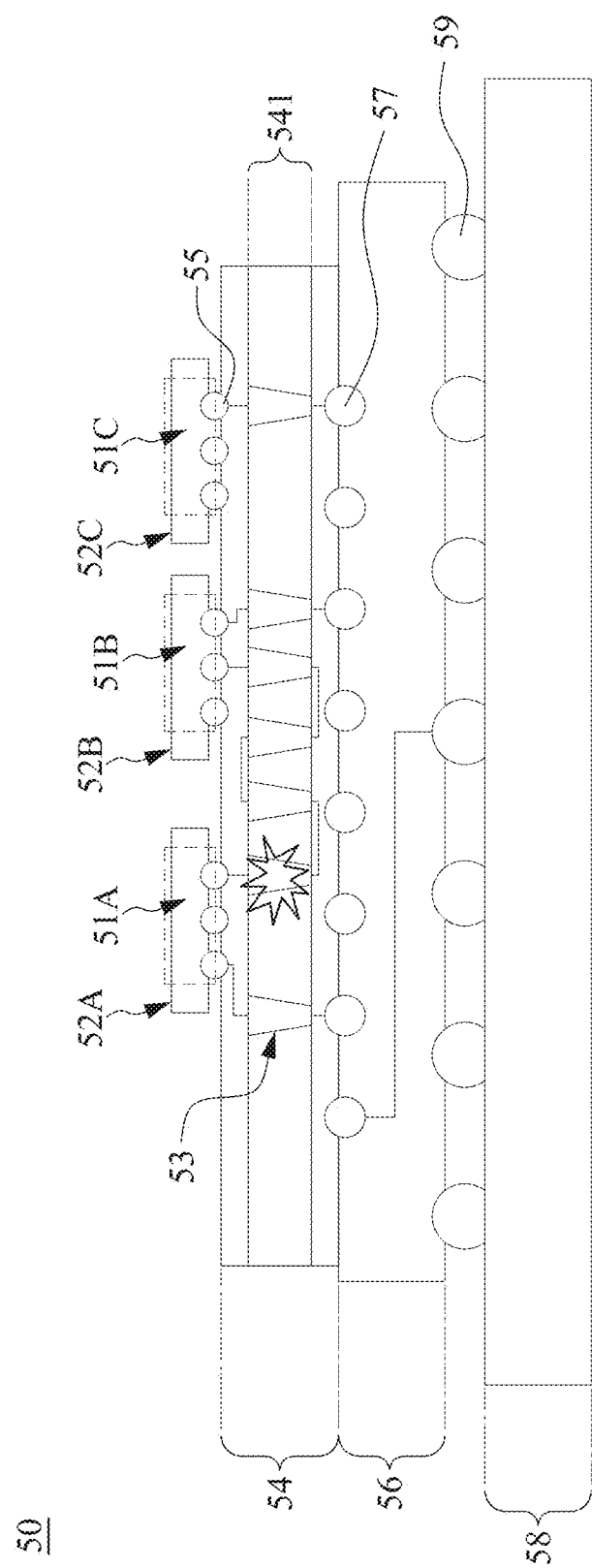
FIG. 6 illustrates an exemplary cross section of a CoWoS (Chip-on-Wafer-on-Substrate) semiconductor device, in accordance with some embodiments of the present disclosure.

FIG. 6 illustrates an exemplary cross section of a CoWoS (Chip-on-Wafer-on-Substrate) semiconductor device 50, in accordance with some embodiments of the present disclosure. As shown in FIG. 6, the CDUs 51A, 51B, and 51C are formed in three semiconductor dies 52A, 52B, and 52C, respectively. Each of the crack sensors of the CDUs 51A, 51B, and 51C may include a metal pattern formed in the semiconductor dies 52A, 52B, and 52C, respectively. The metal patterns formed in the semiconductor dies 52A, 52B, and 52C may be electrically connected through connection elements formed in a wafer 54, connection elements 53 formed in an interposer 541, and connection elements 55 between the semiconductor dies 52A, 52B, and 52C and the wafer 54. The connection elements 53 may be electrically connected to a package substrate 56 via the connection elements formed in a wafer 54 and connection elements 57 between the wafer 54 and the package substrate 56. The package substrate 56 may be electrically connected to a printed circuit board 58 via connection elements formed in the package substrate 56 and connection elements 59 between the package substrate 56 and the printed circuit board 58. In some embodiments, the connection elements 55 may comprise bumps. In some embodiments, the connection elements 57 may comprise bumps. In some embodiments, the connection elements 59 may comprise Ball Grid Arrays (BGA).

The connections between the semiconductor dies 52A, 52B, and 52C may be through the wafer 54. In some embodiments, the connections between the semiconductor dies 52A, 52B, and 52C may be through the package substrate 56. In some embodiments, the connections between the semiconductor dies 52A, 52B, and 52C may be through the print circuit board 58. In some embodiments, the connections between the semiconductor dies 52A, 52B, and 52C may be through a combination of the wafer 54, the substrate 56, or the print circuit board 58. Some available pads of the semiconductor dies 52A, 52B, and 52C may be used for the detection pads of the CDUs 51A, 51B, and 51C.

The connections between the metal patterns of the CDUs 51A, 51B, and 51C may be through the wafer 54. In some embodiments, the connections between the metal patterns of the CDUs 51A, 51B, and 51C may be through the package substrate 56. In some embodiments, the connections between the metal patterns of the CDUs 51A, 51B, and 51C may be through the print circuit board 58. In some embodiments, the connections between the metal patterns of the CDUs 51A, 51B, and 51C may be through a combination of the wafer 54, the substrate 56, or the print circuit board 58.

In FIG. 6, the CDUs 51A, 51B, and 51C can be used to detect whether the stacking of the semiconductor dies 52A, 52B, and 52C, the wafer 54, the package substrate 56 and the print circuit board 58 are successfully stacked. If the output digital states of the CDUs 51A, 51B, and 51C are all "1," the semiconductor dies 52A, 52B, and 52C, the wafer 54, the package substrate 56 and the print circuit board 58 are successfully stacked. If the output digital states of the CDUs 51A, 51B, and 51C contains "0," the lookup table formed by the output digital states of the CDUs 51A, 51B, and 51C can be used to check whether the crack is formed in the semiconductor dies 52A, 52B, and 52C, the wafer 54, the package substrate 56, the print circuit board 58, or the connections therebetween. In a two-dimensional integrated circuit, the CDUs 51A, 51B, and 51C can be used to check whether a crack is induced during die sawing. In a three-dimensional integrated circuit, the CDUs 51A, 51B, and 51C can be used to check whether a crack is induced during die sawing and/or die stacking.

Figure 7:
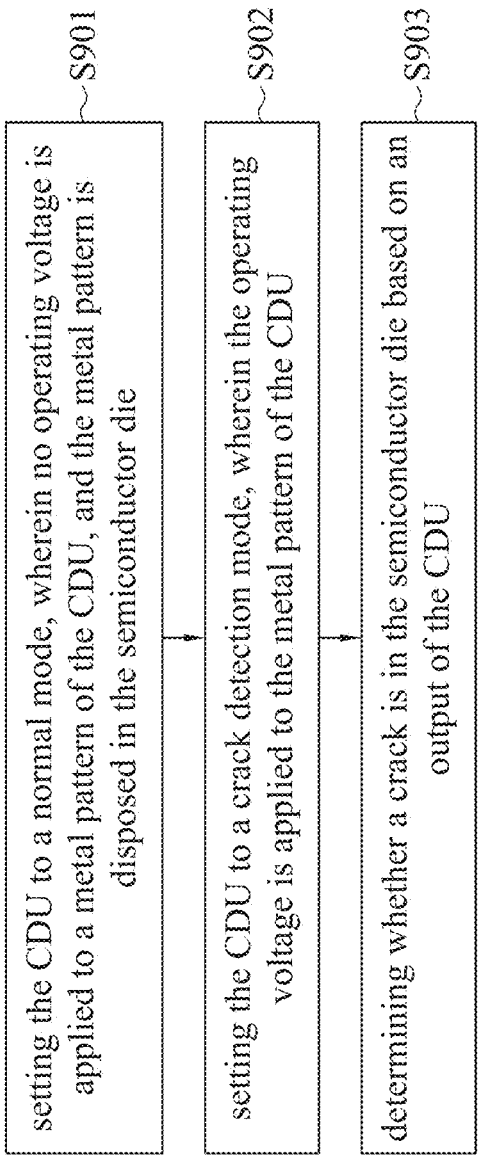
FIG. 7 is a flow chart illustrating a method for detecting a crack of a semiconductor die, in accordance with various aspects of the present disclosure.

FIG. 7 is a flow chart illustrating a method for detecting a crack of a semiconductor die, in accordance with various aspects of the present disclosure.

The method 90 includes operation S901. In operation S901, a CDU is set to a normal mode. An operating voltage is not applied to a metal pattern of the CDU. The metal pattern is disposed in the semiconductor die. Referring back to FIGS. 1 and 3A, the operating voltage VDD is not applied to the metal pattern of the CDU 1.

The method 90 includes operation S902. In operation S902, the CDU is set to a crack detection mode. The operating voltage is applied to the metal pattern of the CDU. Referring back to FIGS. 1 and 3B, the operating voltage VDD is applied to the metal pattern of the CDU 1.

The method 90 includes operation S903. In operation S903, whether a crack is in the semiconductor die is determined based on an output of the CDU. Referring back to FIGS. 1 and 3C, determining whether a crack is in the semiconductor die is based on an output of the CDU 1.

In some embodiments, the semiconductor is connected to a second semiconductor die. Referring back to FIG. 6, at least two of the semiconductor dies 52A, 52B, and 52C are connected. Each of the semiconductor dies 52A, 52B, and 52C includes the CDUs 51A, 51B, and 51C, respectively. Each of the CDUs 51A, 51B, and 51C includes corresponding metal patterns, respectively. At least one of the CDUs 51A, 51B, and 51C determines whether a crack is in the metal patterns of the CDUs 51A, 51B, and 51C, or a connection between the semiconductor dies 52A, 52B, and 52C. The metal patterns of the CDUs 51A, 51B, and 51C are disposed in the semiconductor dies 52A, 52B, and 52C, respectively.

In some embodiments, the CDU comprises a PMOS, an AND logic gate and an NAND logic gate. Referring back to FIGS. 1 and 3A, the logic circuit 12 includes an input 12A1 and an input 12N1. The AND logic gate 12A generates a signal at an output 12AO to a gate electrode 10G of the PMOS 10T based on the signals at the input 12A1 and the output 12NO of the CDU 1. The NAND logic gate 12N generates a signal at an output 12NO to the output of the CDU 1 based on the signal at the input 12N1 and a voltage at a drain electrode 12D of the PMOS 12T.

The method 90 is merely an example, and is not intended to limit the present disclosure beyond what is explicitly recited in the claims. Additional operations can be provided before, during, or after each operations of the method 90, and some operations described can be replaced, eliminated, or moved around for additional embodiments of the method. In some embodiments, the method 90 can include further operations not depicted in FIG. 7.

Some embodiments of the present disclosure provide a crack detector unit (CDU). The CDU comprises a switching circuit, a crack sensor, and a logic circuit. The switching circuit is configured to enable the crack sensor. The crack sensor is configured to be electrically connected to the switching circuit, the ground, and an operating voltage. The logic circuit is configured to be electrically connected to the switching circuit and the crack sensor, wherein the CDU is enabled based on an input of the logic circuit. The output of the logic circuit indicates whether the crack sensor contains a crack.

Some embodiments of the present disclosure provide a semiconductor die. The semiconductor die comprises a first crack detector unit (CDU). The first CDU determines whether a crack is in the semiconductor die. The first CDU comprises a switching circuit, a logic circuit, and a first pattern. The switching circuit is configured to determine whether to enable the first CDU. The logic circuit is electrically connected to the switching circuit. The first pattern is electrically connected to the switching circuit of the first CDU, the ground, and an operating voltage.

Some embodiments of the present disclosure provide a method of detecting a crack in a semiconductor die. The method comprises setting the CDU in a normal mode, wherein no operating voltage is applied to a metal pattern of the CDU, and the metal pattern is disposed in the semiconductor die, setting the CDU to a crack detection mode, wherein the operating voltage is applied to the metal pattern of the CDU, and determining whether a crack is in the semiconductor die based on an output of the CDU.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A crack detector unit (CDU), comprising:
   a switching circuit configured to enable a crack sensor;
   the crack sensor configured to be electrically connected to the switching circuit, the ground, and an operating voltage; and
   a logic circuit configured to be electrically connected to the switching circuit and the crack sensor, wherein the CDU is enabled based on an input of the logic circuit, and an output of the logic circuit indicates whether the crack sensor contains a crack,
   wherein the logic circuit comprises an AND logic gate and an NAND logic gate, and the input of the logic circuit includes a first external input and a second external input, and
   wherein the AND logic gate generates a first output to the switching circuit based on the first external input and the output of the logic circuit, the NAND logic gate generates a second output to the output of the logic circuit based on the second external input and a status of the crack sensor.

2. The CDU of claim 1, wherein the switching circuit comprises a p-type metal-oxide-semiconductor field-effect transistors (PMOS), a source electrode of the PMOS is connected to the operating voltage, a drain electrode of the PMOS is connected to the crack sensor and the logic circuit, and a gate electrode of the PMOS is connected to the logic circuit.

3. The CDU of claim 1, wherein the crack sensor comprises a metal pattern.

4. The CDU of claim 1, wherein the crack sensor comprises multiple metal layers and vias.

5. The CDU of claim 1, wherein the CDU switches between a crack detection mode and a normal mode via the switching circuit.

6. The CDU of claim 1, wherein the output of the logic circuit is "1" when no crack is detected.

7. The CDU of claim 1, wherein the output of the logic circuit is "0" when a crack is detected.

8. The CDU of claim 1, wherein the CDU is built in a semiconductor die.

9. The CDU of claim 1, wherein an output of the switching circuit is input to both the crack sensor and the logic circuit.

10. The CDU of claim 9, wherein the switching circuit includes a metal-oxide-semiconductor field-effect transistors (MOSFET).

11. The CDU of claim 9, wherein the logic circuit includes an AND logic gate and an NAND logic gate.

12. A semiconductor die, comprising:
    a first crack detector unit (CDU), comprising:
      a switching circuit configured to determine whether to enable the first CDU;
      a logic circuit electrically connected to the switching circuit; and
      a first pattern electrically connected to the switching circuit of the first CDU, the ground, and an operating voltage,
    wherein the semiconductor die is connected to a second semiconductor die, the second semiconductor die includes a second pattern, and wherein the second pattern is disposed adjacent to at least one edge of the second semiconductor die, and
    wherein the first CDU determines whether a crack is in the first pattern, the second pattern, or a connection between the semiconductor die and the second semiconductor die.

13. The semiconductor die of claim 12, wherein the first pattern is disposed adjacent to at least one edge of the semiconductor die.

14. The semiconductor die of claim 12, wherein the semiconductor die comprises an active die or a passive die.

15. The semiconductor die of claim 12, wherein the switching circuit comprises a p-type metal-oxide-semiconductor field-effect transistors (PMOS).

16. The semiconductor die of claim 12, wherein the connection between the semiconductor die and the second semiconductor die is through a wafer, a substrate, a print circuit board, or a combination thereof.

17. The semiconductor die of claim 13, further comprising a second CDU, the second CDU connecting to a third pattern, the third pattern disposed on another edge of the semiconductor die.

18. The semiconductor die of claim 17, wherein a lookup table based on outputs of the first crack detector and the second crack detector indicates a location of the crack.

19. A method of detecting a crack in a semiconductor die, comprising:
    setting the CDU to a normal mode, wherein no operating voltage is applied to a metal pattern of the CDU, and the metal pattern is disposed in the semiconductor die;
    setting the CDU to a crack detection mode, wherein the operating voltage is applied to the metal pattern of the CDU; and
    determining whether a crack is in the semiconductor die based on an output of the CDU,
    wherein:

the CDU comprises a PMOS, an AND logic gate, and an NAND logic gate, the logic circuit includes a first external input and a second external input, the AND logic gate generates a first output to a gate electrode of the PMOS based on the first external input and the output of the CDU, and the NAND logic gate generates a second output to the output of the CDU based on the second external input and a voltage at a drain electrode of the PMOS.

20. The method of claim 19, wherein the semiconductor die is connected to a second semiconductor die, the second semiconductor die includes a second metal pattern, and the method further comprising determining whether a crack is in the metal pattern, the second metal pattern, or a connection between the semiconductor die and the second semiconductor die.

* * * * *